United States Patent
Kim et al.

(10) Patent No.: US 7,564,922 B2
(45) Date of Patent: Jul. 21, 2009

(54) RF TRANSMITTER FOR EFFICIENTLY COMPENSATING OUTPUT POWER VARIATION DUE TO TEMPERATURE AND PROCESS

(75) Inventors: Jae-Wan Kim, Suwon-si (KR); Jong-Dae Bae, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 580 days.

(21) Appl. No.: 11/290,534

(22) Filed: Dec. 1, 2005

(65) Prior Publication Data
US 2006/0146956 A1   Jul. 6, 2006

(30) Foreign Application Priority Data
Jan. 4, 2005   (KR) ............... 10-2005-0000564

(51) Int. Cl.
  H04K 1/02   (2006.01)
  H04L 25/03   (2006.01)
  H04L 25/49   (2006.01)

(52) U.S. Cl. ............... 375/297; 375/296; 375/298; 375/300; 455/108; 332/120; 332/145

(58) Field of Classification Search ............... None
See application file for complete search history.

(56) References Cited

U.S. PATENT DOCUMENTS

| | | | |
|---|---|---|---|
| 4,451,801 A * | 5/1984 | Monticelli | 330/278 |
| 4,562,411 A * | 12/1985 | O'Rourke et al. | 331/1 A |
| 5,175,884 A * | 12/1992 | Suarez | 455/260 |
| 5,621,357 A * | 4/1997 | Botti et al. | 330/253 |
| 6,009,313 A * | 12/1999 | Ichiyoshi | 455/76 |
| 6,107,844 A * | 8/2000 | Berg et al. | 327/110 |
| 6,466,096 B1 * | 10/2002 | DeVito | 331/11 |
| 6,466,100 B2 * | 10/2002 | Mullgrav et al. | 331/179 |
| 6,501,337 B1 * | 12/2002 | Tucker | 331/17 |
| 7,010,280 B1 * | 3/2006 | Wilson | 455/126 |
| 7,061,304 B2 * | 6/2006 | Anand et al. | 327/525 |
| 2001/0045817 A1 * | 11/2001 | Cusinato et al. | 323/312 |
| 2003/0174799 A1 * | 9/2003 | Fahim | 375/376 |
| 2004/0106380 A1 * | 6/2004 | Vassiliou et al. | 455/73 |
| 2004/0124938 A1 * | 7/2004 | Nilsson | 332/112 |
| 2005/0078766 A1 * | 4/2005 | Simon | 375/296 |

FOREIGN PATENT DOCUMENTS

| | | |
|---|---|---|
| JP | 2001-057578 | 2/2001 |
| JP | 2001-057579 | 2/2001 |
| JP | 2002-094394 | 3/2002 |
| JP | 2003-179508 | 6/2003 |
| KR | 1020010027307 A | 4/2001 |

* cited by examiner

*Primary Examiner*—Shuwang Liu
*Assistant Examiner*—Gina McKie
(74) *Attorney, Agent, or Firm*—Volentine & Whitt, PLLC (57) ABSTRACT

An RF transmitter includes a modulating circuit adapted to modulating an RF signal, an output amplifier adapted to amplify the modulated RF signal; an auto tuner generating a tuning voltage that varies in accordance with operating temperature fluctuations and/or manufacturing process variances, and a reference current generating circuit adapted to generate a reference current in response to the tuning voltage.

13 Claims, 8 Drawing Sheets

(Prior Art)

RF TRANSMITTER FOR EFFICIENTLY COMPENSATING OUTPUT POWER VARIATION DUE TO TEMPERATURE AND PROCESS

BACKGROUND OF THE INVENTION

1. Field of the Invention

Embodiments of the present invention relate to a radio frequency (RF) transmitter. More particularly, embodiments of the invention relate to an RF transmitter adapted to effectively compensate for output power variations due to the temperature and a process without adversely impacting power consumption.

This application claims priority to Korean Patent Application No. 2005-00564 filed Jan. 4, 2005, the subject matter of which is hereby incorporated by reference.

2. Description of the Related Art

Generally, the RF transmitter of a wireless communication system uses a high power amplifier (HPA) to transmit RF signals through an antenna. However, the output characteristics of the high power amplifier typically change in accordance with variations in temperature. Such temperature variations may be due to changes in the ambient operating temperature for the system, or the development of heat from internal components, such as semiconductor elements, with the high power amplifier. Generally speaking, if the temperature of the high power amplifier rises, its output power falls, but if the temperature of the high power amplifier falls, its output power rises. As a result of this phenomenon, the output power of a high power amplifier will dynamically change in relation to ambient operating temperature variations and/or the quantity of internally generated heat.

The output power of a high power amplifier may also change in relation to variations in the manufacturing process used to make the high power amplifier. That is, although high power amplifiers are manufactured according to a particular set of design specifications using defined manufacturing processes, non-uniform results may nonetheless be obtained due to uncontrolled deviations (or anomalous collective variations) in the processes used to fabricate the constituent semiconductor components of the high power amplifier, for example. Variations in the desired performance parameters between individual high power amplifiers result in variations in output power characteristics. Accordingly, output power variations for high power amplifiers must be conventionally compensated for in order to generate stable RF signals.

Decreased output power from the high power amplifier may degrade the communications link performance otherwise enabled by the RF transmitter. On the other hand, increased output power from the high power amplifier may cause interference with nearby devices.

In order to overcome such problems, an automatic level control loop has been used. The conventional automatic level control loop controls an output power of a power amplifier by detecting output power variations potentially caused by operating temperature fluctuations or manufacturing variances, and thereafter compensating for such variations. However, since the automatic level control loop directly controls the high power amplifier output power, and since the output power comprises RF band energy, a large amount of power may be consumed in the compensation process over the entire range of output power variations expected in many conventional power amplifiers.

Figure 1:
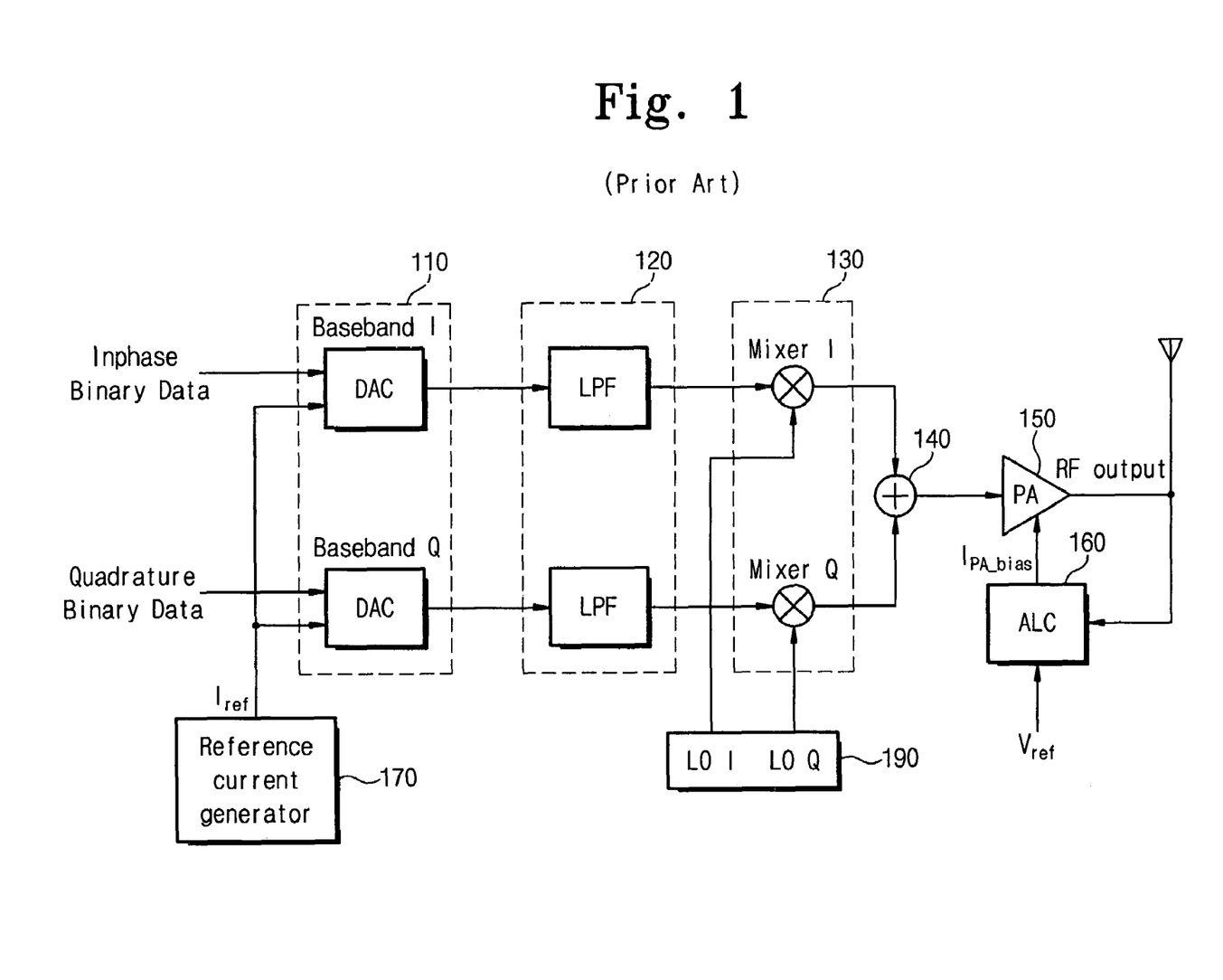
FIG. 1 is a block diagram illustrating a transmitter including a conventional automatic level control loop.

Consider the example illustrated in FIG. 1 which is a block diagram of an RF transmitter including a conventional automatic level control loop.

As shown in FIG. 1, the RF transmitter comprises a digital-to-analog converting unit 110 for converting Inphase binary data to an Inphase analog signal, and converting Quadrature binary data to a Quadrature analog signal. The RF transmitter also comprises a low-pass filtering unit 120, a mixing unit 130 for modulating the Inphase analog signal and the Quadrature analog signal using an RF carrier wave, a signal multiplexer 140 for multiplexing the modulated Inphase signal and the modulated Quadrature signal to generate an RF signal, a power amplifier 150, an automatic level controller 160, and a reference current generator 170.

Digital-to-analog converting unit 110 converts Inphase binary data to an Inphase analog signal and converts Quadrature binary data to a Quadrature analog signal using a reference current $I_{ref}$ provided by reference current generator 170. Output levels of the Inphase analog signal and the Quadrature analog signal are determined by the amplitude of reference current $I_{ref}$.

Low-pass filtering unit 120 filters the Inphase analog signal and the Quadrature analog signal to eliminate high frequency noise and to increase modulation efficiency. That is, low-pass filtering unit 120 generates an Inphase baseband signal and a Quadrature baseband signal by filtering the Inphase analog signal and the Quadrature analog signal.

Mixing unit 130 modulates each of the Inphase baseband signal and the Quadrature baseband signal using a carrier signal provided by a local oscillator circuit 190. Multiplexer 140 multiplexes the modulated Inphase signal and the modulated Quadrature signal to generate the RF signal. The transmitted RF signal is applied to power amplifier 150 for amplification.

Since the inherent power of the RF signal output from multiplexer 140, as applied to the transmitting antenna, is often insufficient to be close the desired wireless communications link at a defined signal-to-noise ratio, power amplifier 150 is used to boost the RF signal. Thus, power amplifier 150 receives a bias current ($I_{PA\_bias}$) and amplifies the power of the RF signal before it is applied to the antenna.

Automatic level controller 160 continuously controls the power of the RF signal. That is, automatic level controller 160 determines a difference value between a reference voltage ($V_{ref}$) and an applied alternating current rectified voltage, and then supplies the bias current ($I_{PA\_bias}$) which is generated in accordance with the difference value. Applied bias current ($I_{PA\_bias}$) is thus a feedback signal to power amplifier 150 which adds or subtracts power from the RF output signal.

In this manner, power amplifier 150 and automatic level controller 160 form a feedback loop that maintains stable output power in the conventional RF transmitter. This feedback loop is often called an automatic level control loop. In the automatic level control loop, the output power of power amplifier 150 is fed back to automatic level controller 160. Automatic level controller 160 converts the output power of power amplifier 150 to a direct current signal by rectifying the output power voltage. This rectified output power voltage is then compared to reference voltage ($V_{ref}$) in order to determine a difference value (a voltage difference). This difference value, once converted to a corresponding current is used to modify (add to or subtract from) the current bias current ($I_{PA\_bias}$) applied to power amplifier 150. In other words, a feedback controlled bias current is supplied to power amplifier 150 in order to control the output of power amplifier 150. A conventional automatic level controller 160 will be explained in some additional detail with reference to FIG. 2.

Figure 2:
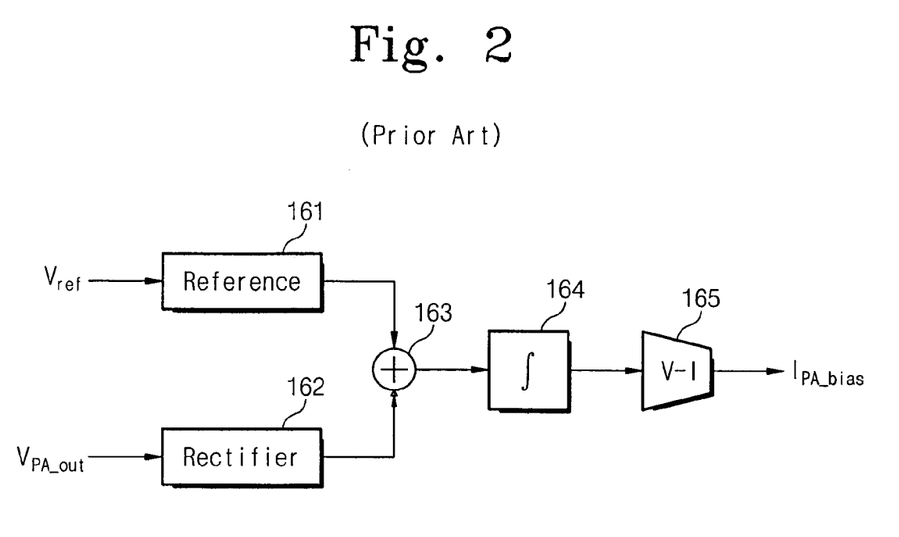
FIG. 2 is a block diagram showing the automatic level controller of FIG. 1 in some additional detail.

FIG. 2 is a block diagram showing an automatic level controller 160 shown in FIG. 1. Referring to FIG. 2, the automatic level controller includes a reference circuit 161 controlling the reference voltage ($V_{ref}$) such that it is stably provided in the presence of variable loading, and a rectifier 162 for rectifying an alternating current voltage which varies in the time domain and is output from power amplifier 150. The automatic level controller 160 also includes an adder 163 for determining a difference value between the reference voltage ($V_{ref}$) and the rectified voltage received from rectifier 162. This difference value is applied to an integrator 164 which accumulates difference values as they vary in the time domain, and a voltage-to-current (V-I) converter 165.

Reference circuit 161 converts (or conditions) an externally supplied voltage to provide the defined reference voltage signal. Rectifier 162 rectifies the alternating current voltage output signal from power amplifier 150 into a direct current (DC) voltage in order to compare the converted DC voltage to the reference voltage. Adder 163 determines the difference value between the converted DC voltage and the reference voltage by subtracting the converted DC voltage from the reference voltage. Integrator 164 integrates the differences received from adder 163. V-I converter 165 generates the bias current ($I_{PA\_bias}$) corresponding to the difference value between the reference voltage and the output voltage, and applies it to power amplifier 150 in order to compensate for variations in output power.

As described above, when the output power of power amplifier 150 increases, power amplifier 150 will output a voltage greater than the reference voltage and adder 163 will subtract the output voltage from power amplifier 150 from the reference voltage ($V_{ref}$). Integrator 164 will intergrate the resulting negative difference values and output a corresponding integrated value to V-I converter 165. V-I converter 165 will then output a reduced operating current ($I_{PA-bias}$) to power amplifier 150 as a bias current, thereby compensating for the increased output of power amplifier 150.

In the approach described above, the power amplifier operating within the RF domain is directly controlled in relation to variation in output signal. That is, the entire range of possible output power variations, whether due to operating temperature fluctuations or manufacturing process variances, is compensated by controlling only the power amplifier. Therefore, the conventional RF transmitter consumes a large amount of power during the compensation process which is dependent upon modifications to the bias current supplied to the power amplifier.

SUMMARY OF THE INVENTION

Embodiments of the invention recognize the need for an RF transmitter adapted to compensate output power variations due to operating temperature fluctuations and/or manufacturing process variances without necessarily consuming the amount of power demanded by conventional RF transmitters.

Thus, in one embodiment the invention provides an RF transmitter, comprising; a modulating circuit adapted to modulate an RF signal to be transmitted, a feedback controlled power amplifier adapted to amplify the RF signal, an auto tuner adapted to generating a tuning voltage that varies in accordance with operating temperature fluctuations or manufacturing process variances, and a reference current generator adapted to generate a reference current in response to the tuning voltage, wherein the modulating circuit is further adapted to control the amplitude of the RF signal in accordance with the tuning voltage and the reference current.

In one related aspect, the auto tuner in the foregoing embodiment may comprise a voltage controlled oscillator (VCO) adapted to generate a frequency controlled signal in response to the tuning voltage, a phase comparator adapted to detect a difference value between the frequency controlled signal and a reference frequency signal, a charge pump adapted to generate a voltage corresponding to the detected difference value, and a loop filter adapted to generate the tuning voltage by filtering the voltage provided by the charge pump.

The VCO or the low pass filter may comprise a resonator using a transconductor as a resistance, wherein the performance characteristics of the transconductor vary with operating temperature fluctuations or manufacturing process variances.

In another embodiment, the invention provides an RF transmitter comprising; a digital-to-analog converter adapted to receive Inphase binary data and Quadrature binary data and further adapted to convert the Inphase binary data and Quadrature binary data to analog baseband signals using a reference current, a low pass filter comprising a transconductor having a resistance that varies in accordance with a tuning voltage and adapted to filter-convert the analog baseband signals, a mixer comprising a transconductor adapted to synchronize the low pass filter to level variations of at least one of the baseband analog signals in accordance with the tuning voltage and adapted to modulate the filtered-converted analog baseband signals onto a carrier signal to generate the RF signal, and a power amplifier receiving and amplifying the RF signal, and configured such that the output of the power amplifier is stabilized by an auto level control loop controlled by the tuning voltage to compensate for operating temperature fluctuations or manufacturing process variances.

BRIEF DESCRIPTION OF THE DRAWINGS

The accompanying drawings, which are included to provide a further understanding of several exemplary embodiments are incorporated in and constitute a part of this application. In the drawings.

DESCRIPTION OF EXEMPLARY EMBODIMENTS

Reference will now be made in some additional detail to several exemplary embodiments of the invention, examples of which are illustrated in the accompanying drawings. However, the scope of the invention is not limited to the illustrated embodiments, but is defined by the claims that follow.

Figure 3:
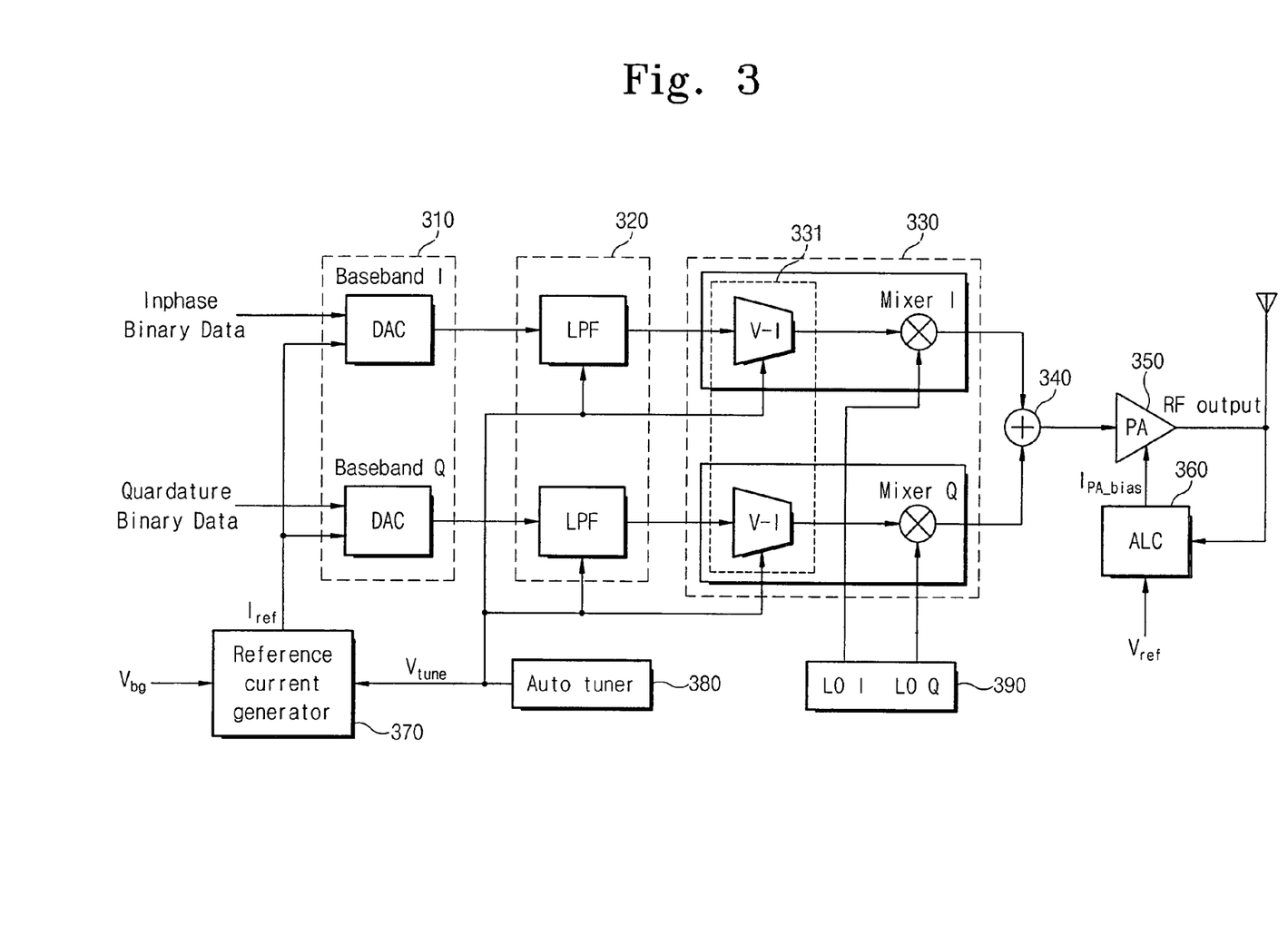
FIG. 3 is a block diagram illustrating a transmitter according to one embodiment of the invention.

FIG. 3 is a block diagram illustrating an RF transmitter according to one embodiment of the invention.

Referring to FIG. 3, the exemplary RF transmitter generally comprises: a digital-to-analog converting unit 310; a low-pass filtering unit 320 comprising a transconductor enabled temperature compensation capability; a mixing unit 330 having front end transconductor 331; a multiplexer 340; a power amplifier 350; an automatic level controller 360; a reference current generator 370; an auto tuner 380 and a local oscillator 390.

Collectively, at least in one embodiment of the invention, digital-to-analog converting unit 310; low-pass filtering unit 320; mixing unit 330; and/or multiplexer 340 may be termed a modulation circuit.

Digital-to-analog converter 310 converts Inphase and Quadrature digital binary data to Inphase and Quadrature baseband analog signals using a reference current ($I_{ref}$) provided by reference current generator 370. In this regard, reference current ($I_{ref}$) acts as a switching current in digital-to-analog converter 310.

Digital-to-analog converting unit 310 may be implemented in a form similar to that of digital-to-analog converting unit 110 described in relation to FIG. 1. However, as used with one embodiment of the invention, digital-to-analog convention unit 310 generates an Inphase baseband signal and a compensated Quadrature baseband signal to compensate for operating temperature fluctuations and/or manufacturing process variances using reference current ($I_{ref}$), as dynamically generated by reference current generator 370. That is, the amplitude of the Inphase baseband and Quadrature baseband signals generated by digital-to-analog converting unit 310 depends on reference (i.e., switching) current ($I_{ref}$).

Low-pass filtering unit 320 filter-converts the Inphase and the Quadrature baseband analog signals received from digital-to-analog converting unit 310 and passes a target lowband frequency of the Inphase and the Quadrature baseband analog signals using a tuning voltage ($V_{tune}$) provided by auto tuner 380. In one embodiment, low-pass filtering unit 320 comprises a $g_m$-C low-pass filter having superior compensation capabilities in relation to signal variations induced by operating temperature fluctuations and manufacturing processing variances. Thus while a conventional low-pass filter might be used to filter undesired frequencies using an RC circuit, the $g_m$-C low-pass filter uses a conductance element ($g_m$) instead of more typical resistance (R) element.

In one more specific embodiment, the conductance element ($g_m$) of low-pass filter 320 comprises a Nauta's transconductor receiving tuning voltage ($V_{tune}$) in order to provide signal compensation as a function of temperature. In this manner, the Nauta's transconductor compensates for temperature variations and low-pass filtering unit 320 compensates the Inphase baseband signal and the Quadrature baseband signal for signal variations induced by operating temperature fluctuations and manufacturing process variances.

Mixing unit 330 compensates (i.e., conditions) the filtered Inphase and the filtered Quadrature baseband signals received from low-pass filtering unit 320 using the tuning voltage ($V_{tune}$) received from auto tuner 380. Mixing unit 330 also modulates the compensated Inphase and the compensated Quadrature signals with an intermediate (e.g., carrier) RF signal received from local oscillator 390, and thereafter outputs the modulated Inphase and the modulated Quadrature signals to multiplexer 340.

In one more particular embodiment, mixing unit 330 includes a V-I converting unit 331 comprising transconductor element which further compensates the Inphase and the Quadrature baseband signals. Here again V-I converting unit 331 may comprise a Nauta's transconductor. After being compensated by V-I converting unit 331, each of the Inphase and Quadrature baseband signals is modulated with the RF carrier signal generated at the local oscillator 390. The characteristics of an exemplary transconductor 331 will be explained in some additional detail with reference to FIG. 4 hereafter.

Multiplexer 340 mixes the modulated Inphase signal and the modulated Quadrature signal to generate the RF signal to be transmitted. Auto tuner 380 generates tuning voltage ($V_{tune}$) which is variable in accordance with operating temperature and manufacturing process variances. Reference current generator 370 receives tuning voltage ($V_{tune}$) from auto tuner 380, and generates reference current ($I_{ref}$) based on tuning voltage ($V_{tune}$) in response to variations in operating temperature and/or manufacturing process variances.

Power amplifier 350 receives the RF signal to be transmitted, which has been previously compensated by mixing unit 330, and amplifies it. During the amplification process, power amplifier 350 fully compensates for variations in the output power of the RF signal using an automatic control loop controlled by auto levelcontroller 360. Power amplifier 350 operates independent of the received baseband signals and therefore fully compensates for any variations in the output power of the RF signal which have not been compensated in the baseband signal processing blocks. In the illustrated example, power amplifier 350 amplifies the RF signal to be transmitted in relation to a bias current ($I_{PA-bias}$) received from auto level controller 360.

Auto level controller 360 detects an output power from power amplifier 350, determines a difference between the detected output power and reference voltage ($V_{ref}$), and generates bias current ($I_{PA-bias}$) in relation to the determined difference value.

Collectively, power amplifier 350 and auto level controller 360 form an auto level control loop to compensate (i.e., stabilize) the output power of power amplifier 350. When the output power of power amplifier 350 is too high, auto level controller 360 detects the increased power, compares the increased power to reference voltage, and generates bias current ($I_{PA-bias}$) reduced by an amount correlated to the comparison derived difference value. The reduced bias current ($I_{PA-bias}$) is then applied to power amplifier 350, and lowers the output power of power amplifier 350. The auto control loop is repeatedly performed until the output power of power amplifier 350 is stabilized. In contrast, when the output power of power amplifier 350 is too low, auto level controller 360 detects the decreased power output and compares it to the reference voltage. An increased bias current ($I_{PA-bias}$) is generated in response to the comparison derived difference value, and supplied to power amplifier 350. The increased bias current ($I_{PA-bias}$) increases the output power of power amplifier 350, and the auto control loop is repeatedly performed until the output power of power amplifier 350 is stabilized. As noted above, the auto level control loop formed by power amplifier 350 and auto level controller 360 performs the foregoing output power stabilization control process independent from the compensation operation in baseband signal processing blocks.

In one embodiment, auto tuner 380 comprises a phase locked loop circuit (PLL) and a voltage controlled oscillator (VOC). Using these constituent circuits, auto tuner 380 provides the tuning voltage ($V_{tune}$) to transconductor 331, which resides in at least one of the baseband signal processing units such as low-pass filtering unit 320 and mixing unit 330, in order to generate the $g_m$ parameter. Thus, transconductor 331 compensates variations in the output power of RF signal to be transmitted while the RF signal is being processed in baseband. Auto tuner 380 will be explained in some additional detail below with reference to FIG. 5.

Local oscillator 390 generates a stabilized RF carrier signal and supplies the RF carrier signal to mixing unit 330 to modulate the Inphase baseband and Quadrature baseband signals by a 90° phase shifting process in order to make the Inphase baseband signal orthogonal to the Quadrature baseband signal.

As described above, the exemplary RF transmitter performs compensation operations in the baseband using a tuning voltage ($V_{tune}$) that varies with temperature fluctuations and manufacturing process variances as provided by auto tuner 380. The reference current ($I_{ref}$) is generated in relation to the tuning voltage ($V_{tune}$) in reference current generator 370 and controls the amplitude of the Inphase baseband and Quadrature baseband signals as a switching current applied to digital-to-analog converting unit 310. Additionally, the exemplary RF transmitter further compensates for any output power variations remaining (or subsequently generated) after the baseband modulation process using an auto control loop formed by the combination of power amplifier 350 and auto level controller 360. With this arrangement, the exemplary RF transmitter consumes less electric power overall while compensating for output power variations by distributing some of the compensation burden to baseband processing circuits with the RF transmitter.

Figure 4:
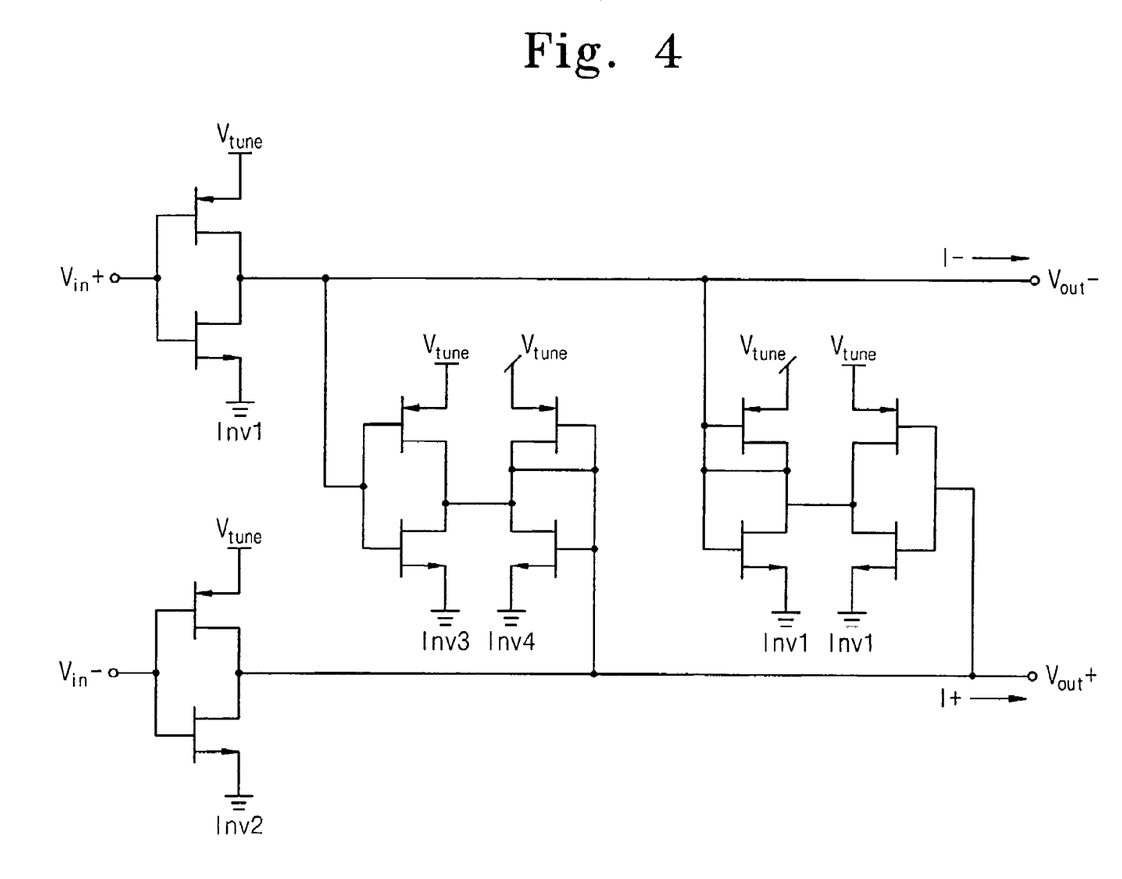
FIG. 4 is a circuit diagram showing one example of a Nauta's transconductance.

FIG. 4 is a circuit diagram illustrating one exemplary transconductor adapted for use in an RF transmitter designed in accordance with one embodiment of the invention. The transconductor shown in FIG. 4 compensates for signal variations potentially caused by operating temperature fluctuations and manufacturing process variance, and may be included, for example, in low pass filtering unit 320, V-I converter 331 as the front end of mixing unit 330, and/or auto tuner 380.

Referring to FIG. 4, the illustrated transconductor is a Nauta's transconductor generally comprising six (6) inverters. For example, the transconductor includes a first inverter (Inv1) and a second inverter (Inv2) adapted to generate a desired trans-conductance ($g_m$) through defined output current operational characteristics, as applied to a differential input voltage ($V_{in}+$ and $V_{in}-$). The illustrated transconductor further comprises third (Inv3) through sixth (Inv6) inverters adapted to fix a differential output current (I + and I −) using a common mode feedback operation. This input voltage-to-output current conversion operation, which significantly characterizes the transconductor element, will be explained in some additional detail.

In one sense, the transconductor may be operated as conventional V-I converter. Input ends of the transconductor receive a differential voltage (e.g., a positive voltage and a negative voltage), and selectively convert the received positive and negative voltage values into negative and positive current values respectively. The trans-conductance property ($g_m$) of the transconductor may be expressed as:

$$g_m = \beta_p(V_{tune} - V_c - |V_{tp}|) + \beta_n(V_c - |V_{tn}|) \quad \text{(Equation 1)}$$
$$= (V_{tune} - |V_{tp}| - V_{tn})\sqrt{\beta_p \beta_n}$$

where, $\beta_p = \mu_p \times C_{OX} \times (W/L)$, as defined by the characteristics of pMOS components, and where, $\beta_n = \mu_n \times C_{OX} \times (W/L)$, as defined by the characteristics of nMOS components. Voltage values $V_{tp}$ and $V_{tn}$ are threshold voltages. Voltage value $V_c$ is a common mode voltage. As may be seen from Equation 1, the trans-conductance($g_m$) of the transconductor may be used to control the applied voltage in terms of the tuning voltage ($V_{tune}$).

Figure 5:
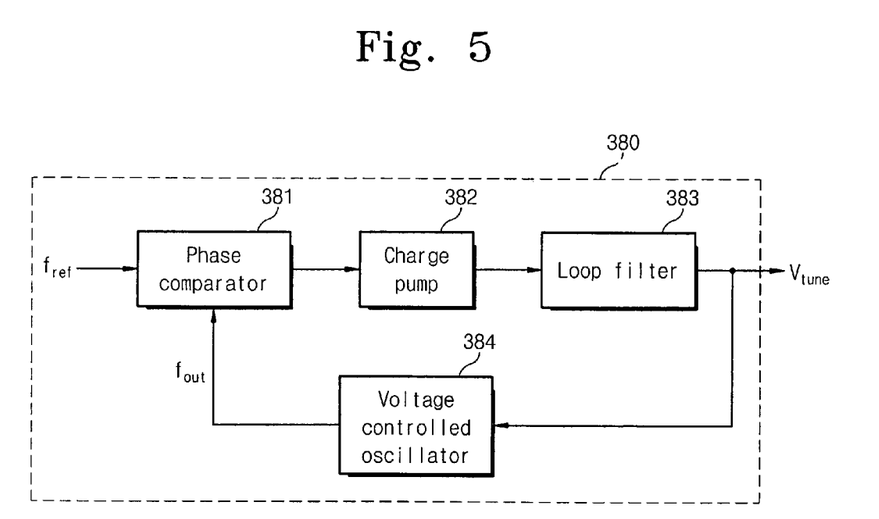
FIG. 5 is a block diagram depicting one example of the auto tuner shown in FIG. 3.

FIG. 5 is a block diagram showing an exemplary auto tuner 380 adapted for use in an RF transmitter according to one embodiment of the invention. Referring to FIG. 5, auto tuner 380 includes a phase comparator 381 detecting a difference value between a reference frequency signal ($f_{ref}$) and a frequency controlled output signal ($f_{out}$) from a voltage controlled oscillator (VCO) 384. Phase comparator 381 then provides an output pulse representing the detected difference value to a charge pump 382. Charge pump 382 converts output pulse from phase comparator 381 to a direct current voltage. A loop filter 383 then provides the tuning voltage ($V_{tune}$) by eliminating any harmonic frequencies contained in the direct current voltage received from charge pump 382. VCO 384 is adapted within this circuit to feedback control the frequency of the tuning voltage ($V_{tune}$) in relation to the amplitude of the tuning voltage ($V_{tune}$) output from loop filter 383. That is, VCO 384 is an oscillator controlling a frequency of tuning voltage ($V_{tune}$) in accordance with the amplitude of a direct current voltage. One exemplary embodiment of VCO 384 will be explained in some additional detail with reference to FIG. 6.

Figure 6:
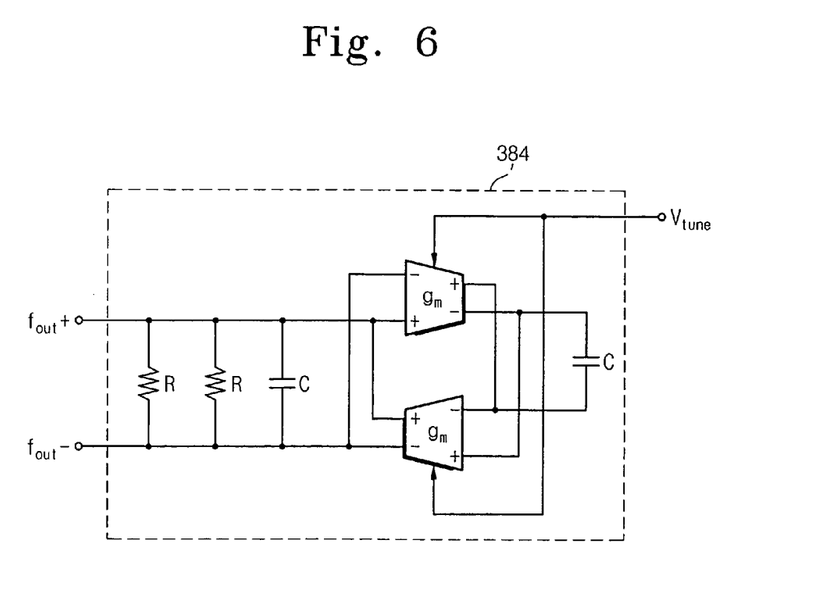
FIG. 6 is a circuit diagram showing the voltage controlled oscillator (VCO) of FIG. 5 in some additional detail.

Referring to FIG. 6, VCO 384 comprises a negative resistance formed by a transconductor element and a $g_m$-C resonator formed from a condenser C. The transconductance ($g_m$) of VCO 384 may be derived, for example, using a circuit equivalent to the Nauta's transconductor used in V-I converter 331 of mixing unit 330 and/or low pass filter 320.

However, VCO 384 might alternatively comprise a conventional RC resonator varying a resistance value with tuning voltage ($V_{tune}$). The frequency controlled output signal ($f_{out}$) is controlled by tuning voltage ($V_{tune}$). That is, the frequency ($f_{out}$) of the output signal is determined by the trans-conductance ($g_m$), which is the inverse of the resistance value. The frequency ($f_{out}$) of the output signal, which is an oscillating frequency of VCO 384, may be expressed as:

$$f_{out} = \frac{g_m}{2\pi C} \quad \text{(Equation 2)}$$

Referring to FIGS. 5 and 6, since auto tuner 380 is a typical phase locked loop (PLL), a ratio of $g_m/C$ denoting the output frequency of VCO 384 is stably maintained and fully defined by the VCO output frequency ($f_{out}$) and the reference frequency ($f_{ref}$). However, if $g_m$ changes due to some operating temperature fluctuation and/or manufacturing process variance, the VCO output frequency ($f_{out}$) also changes. Accordingly, the tuning voltage ($V_{tune}$) provided by loop filter 383 changes to compensate for the accompanying frequency variation. Thus, in one embodiment of the invention, the Nauta's transconductor(s) used in low pass filtering unit 320, and the V-I converter 331 of mixing unit 330 receives the tuning voltage ($V_{tune}$) generated by VCO 384 and the phase lock loop circuit maintains the output frequency ($f_{out}$) as a power voltage applied to all inverters. Therefore, identical sized $g_m$ values may be obtained for each of the low pass filtering unit 320 and V-I converter 331.

Additionally, tuning voltage ($V_{tune}$) provided by auto tuner 380 to the phase lock loop circuit varies with operating temperature fluctuation or manufacture process variance (e.g., migrations from a fast manufacturing process to a slow manufacturing process). So, for example, when the operating temperature rises or an analogous manufacture process varies so as to increase RF transmitter output power, the feedback mechanism described above serves to compensate for (e.g., reduce) the output power of power amplifier 350 to return the system to specification. In a like vein, a decrease in output power may be compensated by increasing the reference current ($I_{ref}$) using an increased tuning voltage ($V_{tune}$) to increase the amplitude of the baseband signals provided by digital-to-analog converting unit 310.

Figure 7:
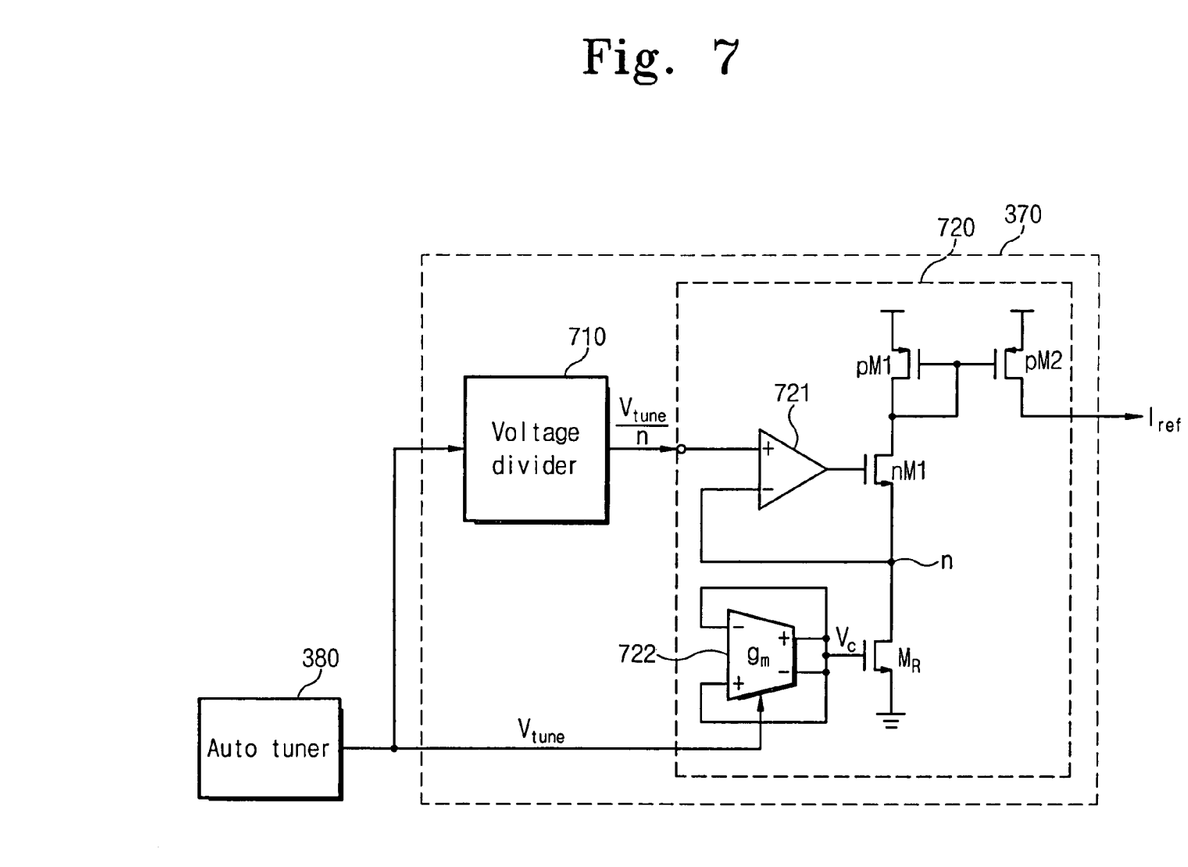
FIG. 7 is a circuit diagram showing one example of the reference current generator shown in FIG. 3.

FIG. 7 is a block diagram illustrating an exemplary reference current generator 370 adapted for use within an RF transmitter according to one embodiment of the invention.

As described above, reference current generator 370 generates the reference current ($I_{ref}$) to compensate for output power variations using the tuning voltage ($V_{tune}$) generated by auto tuner 380. As shown in FIG. 7, reference current generator 370 may comprise a voltage divider 710 adapted to distribute the tuning voltage ($V_{tune}$) in order to provided a subdivided voltage ($V_{tune}/n$), and a current generator 720 adapted to generate a reference current ($I_{ref}$) from tuning voltage ($V_{tune}$) and subdivided voltage ($V_{tune}/n$). As noted above, reference current ($I_{ref}$) is provided to digital-to-analog converting unit 310 as a switching current.

Voltage divider 710 divides the tuning voltage ($V_{tune}$) supplied from auto tuner 380 by "n", and supplies the "n" subdivided voltages to current generator 720. One exemplary voltage divider 710 will be explained in some additional detail hereafter with reference to FIG. 8.

However, the current generator 720 illustrated in FIG. 7 comprises; an n-MOS element $M_R$ adapted to convert the subdivided voltages provided from voltage divider 710 into a current using a constant $g_m$ value instead of using a conventional resistance value. Current generator 720 also comprises a Nauta's transconductor 722 is also provided to supply a gate voltage (i.e., voltage $V_c$ operating in a triode region where the current-voltage characteristics is linear) to n-MOS element $M_R$. Current generator 720 also comprises a buffer voltage supplying circuit formed from an operational amplifier 721 and an n-MOS element nM1 and stably supplying a voltage from voltage divider 710 to the n-MOS element $M_R$, and a current mirror formed from pM1 and pM2 and adapted to extract an output current identical to the current flowing through n-MOS element $M_R$.

Within current generator 720, operational amplifier 721 is a voltage buffer to supply the output voltage of voltage divider 710 to be loaded at a "node n." The n-MOS element nM1 is a switch element interrupting countercurrent by applying the current following through the n-MOS element $M_R$ to the current mirror. If the Nauta's transconductor 722 is designed to have an n-MOS trans-conductance ($g_m$) identical to p-MOS transconductor ($g_m$), the entire conductance ($g_m$) can be simplified as an approximate value shown as:

$$g_m = \beta_p(V_{tune} - V_C - |V_{tp}|) + \beta_n(V_C - |V_{tn}|) \quad \text{(Equation 3)}$$
$$\cong (2\beta_p(V_C - V_{tp}))$$

Accordingly, if voltage $V_C$ applied to a gate of the n-MOS element $M_R$ is operated in the triode linear area, a resistance value of the n-MOS element $M_R$ becomes a constant resistance value expressed as:

$$R \cong \frac{1}{\beta_n(V_c - V_{tn})} \quad \text{(Equation 4)}$$
$$\cong \frac{2}{g_m}$$

Therefore, the output current ($I_{ref}$) of reference current generator 370 can be expressed as:

$$Iref = \frac{V_{tune}}{n} \cdot \frac{1}{R} = \frac{g_m}{2} \cdot \frac{V_{tune}}{n} = \frac{\alpha}{n} = V_{tune} \quad \text{(Equation 5)}$$

Within Equation 5, a central current value of reference current $I_{ref}$ is set as α which is determined to be equal to ($g_m/2$), and a parameter "n" sets a range of current values varied according to possible temperature fluctuations and/or manufacturing process variances. Accordingly, an amplitude central value and a compensating range for digital-to-analog converting unit 310 may be readily designed and controlled.

Figure 8:
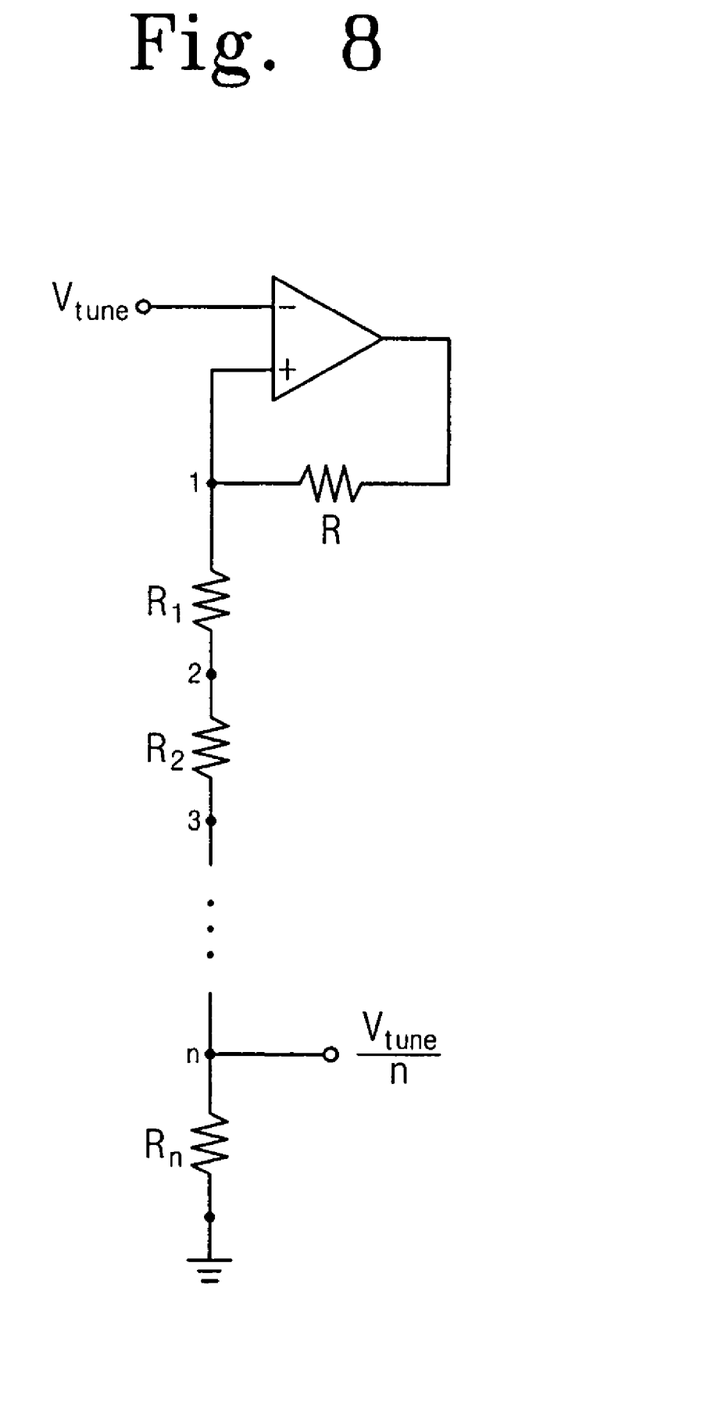
FIG. 8 is a circuit diagram showing on example of the voltage divider shown in FIG. 7.

FIG. 8 is a circuit diagram showing an exemplary voltage divider 710 adapted to generate reference current ($I_{ref}$) using a parameter "n" to control tuning voltage ($V_{tune}$). As shown, voltage divider 710 includes a plurality of resistances defining an output. The divided output voltage can be simply controlled by the number of resistances used and the location of the output within the series of resistances.

As described above, auto tuner 380 generates tuning voltage ($V_{tune}$) which varies with temperature fluctuations and/or manufacturing process variances through the operation of a phase locked loop circuit comprising VOG 384. Reference current generator 370 generates a reference current ($I_{ref}$) that varies similarly based on the tuning voltage ($V_{tune}$). Digital-to-analog converting unit 310 converts digital data into analog signals using the reference current ($I_{ref}$) as the switching current. That is, an RF transmitter according to one embodiment of the invention stabilizes its output power by controlling digital-to-analog converting unit 310 in order to generate compensated baseband signals using the reference current as the switching current. Also, low pass filtering unit 320 and mixing unit 330 commonly use the tuning voltage ($V_{tune}$) in order to match a reference level and operating characteristics for the modulated signal. Furthermore, the auto level control loop formed by the combination of auto level controller 360 and power amplifier 350 further compensates for residual variations in output power after the generation of compensated modulated signals.

Figure 9:
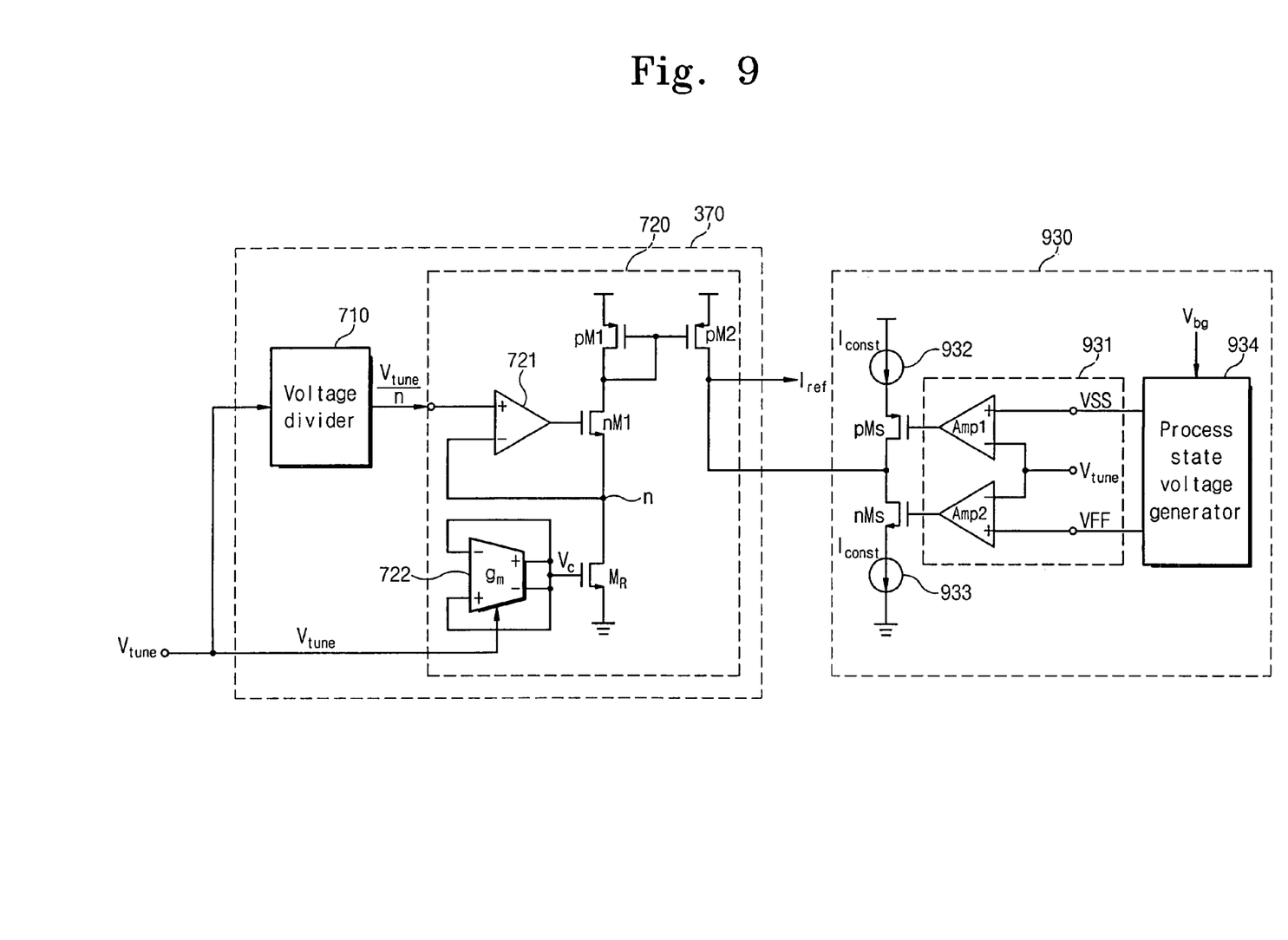
FIG. 9 is a circuit diagram showing the reference current generator of FIG. 3 according to another embodiment of the present invention.

FIG. 9 is a block diagram illustrating another exemplary reference current generator 370 together with a process compensating unit 930. This combination of elements further compensates for output power variations and may be readily adapted to embodiments of the invention.

As shown in FIG. 9, process compensating unit 930 comprises; a comparator 931 formed from ganged operational amplifiers, constant current sources 932 and 933 adapted to add to or subtract from the reference current ($I_{ref}$) in relation to output power variations arising from manufacturing process variances. Process compensating unit 930 further comprises MOS switches pMs and nMs for selecting one of the constant current sources 932 and 933, and a process state voltage generator 934 for supplying a maximum or minimum reference voltage obtained from simulations.

The exemplary comparator 931 comprises Amp1 and Amp2, each receiving non-inverted tuning voltage ($V_{tune}$), which varies with manufacturing process variances, at its inverting input. One process state voltage (VSS) is used as an appropriate reference for the amplitude of the tuning voltage ($V_{tune}$) when a manufacturing process used to form the n-MOS and p-MOS elements is slow. Another process state voltage (VFF) is used as an appropriate reference voltage for the amplitude of the tuning voltage ($V_{tune}$) when a manufacturing process used to form the n-MOS and p-MOS elements is fast. Accordingly, the first process state voltage (VSS) is greater than the second process state voltage (VFF) (i.e., VSS>VFF). Therefore, Amp1 and Amp2 will output negative values when the tuning voltage ($V_{tune}$) is greater than the first process state voltage (VSS). However, Amp1 and Amp2 will output positive values when the tuning voltage ($V_{tune}$) is less than the second process state voltage (VFF).

The MOS switches pMs, nMs are turned ON/OFF according to the output voltage of comparator 931. If the output voltage of comparator 931 is positive, the n-MOS switch (nMs) is ON and the p-MOS switch (pMs) is turned OFF. However, if the output voltage of comparator 931 is negative, the n-MOS switch (nMs) is turned OFF and the p-MOS switch (pMs) is turned ON. And, if the tuning voltage ($V_{tune}$) is greater than the second process state voltage (VFF), but less than the first process state voltage (VSS) (i.e., VSS>Vtune>VFF), the MOS switches are both turned OFF, and the reference current ($I_{ref}$) is used without addition or subtraction.

Constant current sources 932 and 933 supply a constant current ($I_{const}$) to be added to or subtracted from the reference current ($I_{ref}$) provided by reference current generator 370 according to a tuned ON/OFF state of the respective MOS switches. In one embodiment, constant current sources 932 and 933 may be current sources passing through a voltage-current converter by receiving a band-gap voltage because the amplitude of the current must be constantly maintained in accordance with variations caused by operating temperature fluctuations and/or manufacturing process variances.

Process state voltage generator 934 generates the first and second process state voltages (VSS, VFF) using, for example, a voltage divider in order to stably supply the process state voltages in the face of operating temperature fluctuations and manufacturing process variances. Appropriate process state voltages (VSS, VFF) may be obtained from simulations using a band-gap voltage which is a constant voltage against variations of peripheral environment.

As descried above, process compensating unit 930 compensates the reference current ($I_{ref}$) provided from reference current generator 370 in relation to variations in manufacturing process speed. If the manufacturing process is SS(n-MOS, p-MOS), the p-MOS switch (pMs) is turned ON and the n-MOS switch (nMs) is turned OFF. Accordingly, the constant current ($I_{const}$) is added to the reference current ($I_{ref}$). On the other hand, if the manufacturing process is FF(n-MOS, p-MOS), the p-MOS switch (pMs) is turned OFF and the n-MOS switch (nMs) is turned ON. Accordingly, the constant current ($I_{const}$) is subtracted from the reference current ($I_{ref}$). That is, process compensating unit 930 compensates the output power variation due to the manufacturing process deviation by adding or subtracting a predetermined current to/from the reference current ($I_{ref}$) according to a type of a manufacturing process.

As described above, in the conventional RF transmitter, the output power variation is compensated only by the auto level control loop. However, an RF transmitter designed in accordance with the present invention compensates the output power variation due to the temperature variation and the manufacturing process by generating the reference current ($I_{ref}$) based on the tuning voltage ($V_{tune}$) varied according to the temperature variation and the manufacturing deviation for the digital-to-analog converting unit to compensate the output power variation in baseband before the auto level control loop performs the compensation operations.

Therefore, an RF transmitter designed in accordance with embodiments of the present invention consumes less electric power to compensate the output power variation and effectively stabilizes the output power of the transmitter by performing the compensation operations not only in the auto level control loop but also in the baseband.

As described above, an RF transmitter according to embodiments of the present invention effectively compensates for output power variations due to the operating temperature fluctuations and/or manufacturing process variances while using less power. Accordingly, it is expected that high performance, analog integrated circuits adapted to implement the inventive RF transmitter will be susceptible to manufacture with higher yield rates, and thus, a lower price point.

Those skilled in the art will understand that various modifications and alterations to the foregoing embodiments are possible. Such modifications and alterations to the exemplary embodiments are covered within the scope of the appended claims that follow and/or by their equivalents.

What is claimed is:

1. A radio frequency (RF) transmitter, comprising:
    a modulating circuit adapted to modulate an RF signal to be transmitted;
    a feedback controlled power amplifier adapted to amplify the RF signal;
    an auto tuner adapted to generate a tuning voltage that varies in accordance with operating temperature fluctuations or manufacturing process variances; and
    a reference current generator adapted to generate a reference current in response to the tuning voltage,
    wherein the modulating circuit is further adapted to control the amplitude of the RF signal in accordance with the tuning voltage and the reference current.

2. The RF transmitter of claim 1, wherein the auto tuner comprises:
    a voltage controlled oscillator (VCO) adapted to generate a frequency controlled signal in response to the tuning voltage;
    a phase comparator adapted to detect a difference value between the frequency controlled signal and a reference frequency signal;
    a charge pump adapted to generate a voltage corresponding to the detected difference value; and
    a loop filter adapted to generate the tuning voltage by filtering the voltage provided by the charge pump.

3. The RF transmitter of claim 2, wherein the VCO comprises a resonator using a transconductor as a resistance, wherein performance characteristics of the transconductor vary with operating temperature fluctuations or manufacturing process variances.

4. The RF transmitter of claim 3, wherein the auto tuner further comprises a phase locked loop circuit, and wherein the tuning voltage varies in accordance with operating temperature fluctuations or manufacturing process variances when a phase of the phase locked loop circuit is locked.

5. The RF transmitter of claim 1, wherein the modulating circuit comprises:
    a digital-to-analog converter adapted to receive the reference current and further adapted to convert input digital data to analog signals;
    a low pass filter adapted to filter-convert the analog signals; and, a mixer adapted to modulate the filtered-converted analog signals to form the RF signal.

6. The RF transmitter of claim 5, wherein the low pass filter comprises a transconductor having a resistance that varies with the tuning voltage.

7. The RF transmitter of claim 5, wherein the mixer comprises a transconductor adapted to synchronize the low pass filter to level variations of at least one of the analog signals in accordance with the tuning voltage.

8. The RF transmitter of claim 1, wherein the feedback controlled power amplifier comprises:
- a power amplifier adapted to receive a bias current, and further adapted to amplify the RF signal provided by the modulating circuit; and
- an auto level controller adapted to compare an output voltage for the power amplifier with a reference voltage, and further adapted to variably generate the bias current in accordance with the comparison.

9. The RF transmitter of claim 1, wherein the reference current generating circuit comprises:
- a voltage divider adapted to generate a reference voltage in response to the tuning voltage; and
- a current generator adapted to receive the reference voltage, and further adapted to generate the reference current in accordance with the tuning voltage.

10. The RF transmitter of claim 9, wherein the reference current generating circuit further comprises a process compensating unit connected to a current node at which the reference current is apparent.

11. The RF transmitter of claim 10, wherein the process compensating unit comprises:
- a process state voltage generator adapted to generate a first process state voltage representing a fast process state and a second process state voltage representing a slow process state;
- a first constant current source and a first switch serially connected to the current node;
- a second switch and a second constant current source serially connected to the current node; and
- a switch controller adapted to control the first switch and the second switch in response to the first process state voltage, the second process state voltage, and the tuning voltage.

12. A radio frequency (RF) transmitter, comprising:
- a digital-to-analog converter adapted to receive inphase binary data and Quadrature binary data and further adapted to convert the inphase binary data and Quadrature binary data to analog baseband signals using a reference current;
- a low pass filter comprising a transconductor having a resistance that varies in accordance with a tuning voltage and adapted to filter-convert the analog baseband signals;
- a mixing unit comprising a transconductor adapted to synchronise the low pass filter to level variations of at least one of the baseband analog signals in accordance with the tuning voltage and adapted to modulate the filtered-converted analog baseband signals onto a carrier signal to generate the RF signal;
- an auto tuner outputting the tuning voltage to the low pass filter and to the mixing unit; and
- a power amplifier receiving and amplifying the RF signal, and configured such that the output of the power amplifier is stabilized by an auto level control loop controlled by a reference voltage.

13. The RF transmitter of claim 12, further comprising:
a reference current generator adapted to generate the reference current in response to the tuning voltage.

* * * * *